United States Patent [19]

Stahlhofen et al.

[11] Patent Number: 5,225,310

[45] Date of Patent: Jul. 6, 1993

[54] PHOTOSENSITIVE MIXTURE CONTAINING AN ESTER OR AMIDE OF 1,2-NAPHTHOQUINONE DIAZIDE SULFONIC OR CARBOXYLIC ACID, A PHENOLIC BINDER RESIN AND A BIS-(4-HYDROXYPHENYL) SPEED ENHANCING COMPOUND

[75] Inventors: Paul Stahlhofen; Otfried Gaschler, both of Wiesbaden, Fed. Rep. of Germany

[73] Assignee: Hoechst Aktiengesellschaft, Frankfurt am Main, Fed. Rep. of Germany

[21] Appl. No.: 202,194

[22] Filed: Jun. 2, 1988

[51] Int. Cl.$^5$ .................... G03F 7/023; G03C 1/61

[52] U.S. Cl. .................... 430/165; 430/191; 430/192; 430/193

[58] Field of Search ............. 430/191, 192, 193, 165

[56] References Cited

U.S. PATENT DOCUMENTS

| | | | |
|---|---|---|---|
| 3,046,118 | 7/1962 | Schmidt | 430/193 |
| 3,061,430 | 10/1962 | Uhlig et al. | 96/33 |
| 3,130,047 | 4/1964 | Uhlig et al. | 96/33 |
| 3,130,048 | 4/1964 | Fritz et al. | 96/33 |
| 3,130,049 | 4/1964 | Neugebauer et al. | 96/33 |
| 3,260,599 | 7/1966 | Lokken | 430/152 |
| 3,640,992 | 2/1972 | Sus et al. | 260/141 |
| 3,661,582 | 5/1972 | Broyde | 96/36.2 |
| 4,115,128 | 9/1978 | Kita | 96/91 D |
| 4,266,000 | 5/1981 | Stahlhofen et al. | 430/192 |
| 4,266,001 | 5/1981 | Buhr et al. | 430/192 |
| 4,275,139 | 6/1981 | Stahlhofen | 430/192 |
| 4,307,173 | 12/1981 | Gventer | 430/165 |
| 4,363,866 | 12/1982 | Rennison et al. | 430/191 |
| 4,424,270 | 1/1984 | Erdmann et al. | 430/166 |
| 4,460,674 | 7/1984 | Uehara et al. | 430/190 |
| 4,544,629 | 10/1985 | Takahashi et al. | 430/191 |
| 4,594,306 | 6/1986 | Stahlhofen et al. | 430/191 |
| 4,626,492 | 12/1986 | Eilback | 430/192 |

FOREIGN PATENT DOCUMENTS

| | | | |
|---|---|---|---|
| 150047 | 8/1985 | Japan | 430/191 |
| 739654 | 11/1955 | United Kingdom . | |
| 1294105 | 10/1972 | United Kingdom . | |
| 1494640 | 12/1977 | United Kingdom | 430/191 |

OTHER PUBLICATIONS

English translation of Japanese Publication No. 50-150,047, published Jan. 17, 1984.
English Abstract of Japanese Pat. Pub. No. 60-150,047, Published Dec. 18, 1985, (Nishioka).
English Abstract of Japanese Pat. Pub. No. 58-203,434, Published Nov. 26, 1983, (Katsuragi).

*Primary Examiner*—Charles L. Bowers, Jr.
*Assistant Examiner*—Christopher G. Young
*Attorney, Agent, or Firm*—Foley & Lardner

[57] ABSTRACT

The invention relates to a photosensitive mixture which essentially contains an ester or an amide of a 1,2-naphthoquinonediazide sulfonic or carboxylic acid as the photosensitive compound, a phenolic resin which is soluble in aqueous-alkaline solutions and insoluble in water as the binder, and an additional speed enhancer, which corresponds to the general formula

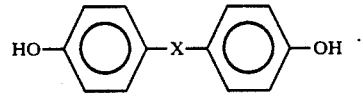

where X denotes a single bond, $CH_2$, $SO_2$, S, CO, $C(CH_3)_2$, $CHCCl_3$ or

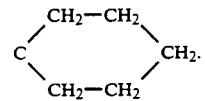

Biphenyldiol-(4,4'), bis-(4-hydroxyphenyl)-ketone, 2,2-bis-(4-hydroxy-phenyl)-propane or bis-(4-hydroxyphenyl)-sulfone are described as suitable compounds. The mixture is employed as photosensitive layers in recording materials suitable for the production of printing forms.

The invention provides for an increased photospeed, without any disadvantages occurring in respect of the copying or printing behavior.

19 Claims, No Drawings

PHOTOSENSITIVE MIXTURE CONTAINING AN ESTER OR AMIDE OF 1,2-NAPHTHOQUINONE DIAZIDE SULFONIC OR CARBOXYLIC ACID, A PHENOLIC BINDER RESIN AND A BIS-(4-HYDROXYPHENYL) SPEED ENHANCING COMPOUND

BACKGROUND OF THE INVENTION

The present invention relates to a positive-working, photosensitive mixture of an ester or an amide of a 1,2-naphthoquinonediazide sulfonic or carboxylic acid as the photosensitive compound, a phenolic resin which is soluble in aqueous alkaline solutions and insoluble in water as the binder, and a speed enhancer. The invention also relates to a photosensitive recording material which is produced from a layer support and a layer comprising the photosensitive mixture, and to the use of this material.

Photosensitive compositions or recording materials, respectively, the imagewise-exposed areas of which become soluble in a developer solution and the unexposed areas of which remain insoluble have been known for a long time. For the preparation of such materials, layers which contain o-quinonediazides as photosensitive compounds and which contain resins with groups providing alkali solubility, for example phenolic resins, as binders are primarily used in practice.

Copying layers of this type have, however, a relatively unsatisfactory photospeed. Therefore, various attempts have been made to improve the photospeed of radiation-sensitive materials based on an o-quinonediazide compound and an alkali-soluble phenolic resin. The photospeed of the recording layer can be enhanced, for example, by reducing the amount of alkali-soluble phenolic resin or by increasing the amount of o-quinonediazide compound. It is a disadvantage of these proposed improvements that the required resistance to overdevelopment of the material and the development range, i.e., the time available for an optimum development, are reduced. Therefore, measures of this kind cause problems in practical use.

By combining o-quinonediazide compounds with phenolic resins possessing increased solubility in aqueous-alkaline developers, the photospeed can be apparently increased, but here, too, the resistance to overdevelopment decreases and the development range gets too short for practical purposes.

There have also been attempts to improve the photospeed by incorporating special sensitizers into the photosensitive mixture.

U.S. Pat. No. 3,661,582 teaches the addition of certain heterocyclic compounds, such as 2-azacyclononan-2-one, indole, quinazoline or tetrazole, to mixtures containing o-naphthoquinonediazides, in order to improve the photospeed of the mixtures. In this case, too, an extremely narrow development range results.

Japanese Patent Application No. 42 449/1971 describes various additives, for example, triphenylmethane dyes, benzaldehyde-m-tolylhydrazone, halogenated hydrocarbons and azo dyes, that are intended to improve the photographic sensitivity; however, none of these compounds has a significant effect.

In German Offenlegungsschrift No. 26 57 922, equivalent to U.S. Pat. No. 4,115,128, the addition of cyclic acid anhydrides is disclosed for the same purpose as above. Here, too, increased photospeed can only be achieved at the expense of reduced resistance to overdevelopment. Similar results are obtained when gallic acid is added to the recording layer to increase the photospeed, in accordance with German Offenlegungsschrift No. 32 01 151.

German Offenlegungsschrift No. 28 47 878, equivalent to U.S. Pat. No. 4,275,139, describes the addition of a condensation product obtained from formaldehyde and a hydroxybenzophenone to a photosensitive mixture, in order to increase the photospeed. It is true that the photospeed is considerably increased by the addition of this type of polycondensation products, where the hydroxybenzophenone molecules are mutually linked via methylene bridges and at least one OH-group must be adjacent to the carbon atom carrying the carbonyl group, but it is a disadvantage that either relatively large amounts of the admixture are required or the resistance to chemicals of the printing stencil is reduced. It has also been found that in the presence of the condensation product obtained from 2,3,4-trihydroxybenzophenone and formaldehyde the resulting photospeed strongly depends on the type of development chosen. If development is, for example, performed by immersion in a developer bath, the resulting photospeed, measured by means of a continuous-tone test wedge, is considerably higher than in those cases where development is performed manually.

SUMMARY OF THE INVENTION

It is therefore an object of the present invention to increase the photospeed of a photosensitive mixture based on an o-naphthoquinonediazide compound and an alkali-soluble phenolic resin, without adversely affecting any other essential property of the copying layer.

These and other objects are achieved by providing a photosensitive mixture comprising, in admixture, an ester or amide of a 1,2-napthhoquinonediazide sulfonic or carboxylic acid, present in an amount sufficient to render the mixture photosensitive; a phenolic resin binder that is soluble in aqueous-alkaline solutions and insoluble in water, present in an amount sufficient to produce a uniform film when the mixture is cast; and a speed enhancer comprising a compound of the general formula

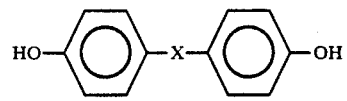

where X denotes a single bond, $CH_2$, $SO_2$, S, CO, $C(CH_3)_2$, $CHCCl_3$ or

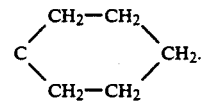

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The concentration of the bis-(4-hydroxyphenyl) compounds according to this invention in the photosensitive mixture can be varied within relatively wide limits. It preferably is between about 0.5% and 15% by weight, in particular between about 1% and 10% by weight, relative to the weight of the non-volatile constituents of the mixture. Biphenyldiol-(4,4'), bis(4-hydroxyphenyl)-ketone, 2,2-bis-(4-hydroxyphenyl)-propane or bis-(4-hydroxyphenyl)-sulfone are preferably employed as admixtures for the photosensitive mixtures according to this invention.

The speed-enhancing compounds employed as admixtures are commercially available or can be prepared by methods previously described in the literature.

Of the 1,2-naphthoquinonediazide compounds, the sulfonic acid derivatives, in particular the esters with aromatic hydroxy compounds, are preferred. The sulfonic acid group generally is in the 4- or 5-position of the naphthalene nucleus, the 5-sulfonic acid derivatives being preferred. Suitable naphthoquinonediazides are known from German Patent No. 938,233 (equivalent to Great Britain Patent No. 739,654); German Patent No. 1,124,817 (equivalent to U.S. Pat. No. 3,061,430); German Patent No. 1,109,521 (equivalent to U.S. Pat. No. 3,130,047); German Patent No. 3,100,077 (equivalent to U.S. Pat. No. 4,424,270); German Patent No. 1,120,273 (equivalent to U.S. Pat. No. 3,130,048); German patent No. 1,114,705 (equivalent to U.S. Pat. No. 3,130,049); German Patent No. 1,543,721 (equivalent to U.S. Pat. No. 3,640,992); German Offenlegungsschrift No. 27 42 631 (equivalent to U.S. Pat. No. 4,266,000) and German Offenlegungsschrift No. 28 28 037 (equivalent to U.S. Pat. No. 4,266,001).

The quantity of naphthoquinonediazide compounds in the mixture generally ranges from about 3% to 50% by weight, preferably from about 8% to 25% by weight, based on the weight of the nonvolatile constituents of the mixture.

The novolak condensation resins which are widely used in many positive copying materials based on 1,2-quinonediazide have also proved advantageous for use as binders in the present invention. The novolaks can also be modified in a known manner, by reacting part of their hydroxy groups with, for example, chloroacetic acid, isocyanates, epoxides, or carboxylic acid anhydrides. Further suitable binders which are soluble or swellable in alkali include polyhydroxyphenol resins prepared by condensation of phenols with aldehydes or ketones, copolymers of styrene and maleic anhydride or polyvinylphenols. Polymers or copolymers of an acrylic or methacrylic acid ester, which has been esterified with a polyvalent phenol, are employed advantageously. The type and quantity of the alkali-soluble resin used may vary depending on the intended application; preference is given to quantities ranging between about 90% and 30% by weight, in particular between about 85% and 55% by weight, based on the total solids content.

In addition, numerous other resins can be used in combination. A combination of a cresol-formaldehyde novolak and a non-plastified, preferably alkyl-etherified, melamine-formaldehyde resin is particularly preferred. It is also possible additionally to employ epoxy resins and vinyl polymers, such as polyvinyl acetates, polyacrylates, polyvinyl ethers, polyvinyl acetals, polyvinylpyrrolidones and copolymers of the monomers on which they are based, as well as hydrogenated or partially hydrogenated derivatives of colophony. The most favorable proportion of said resins depends on the application requirements and the effect on the development conditions, and is in general not more than about 40% by weight, preferably about 1% to 20% by weight, of the alkali-soluble resin.

To meet special requirements, such as flexibility, adhesion, gloss and coloration, the photosensitive mixture can also contain substances, such as polyglycols, cellulose derivatives, e.g., ethyl cellulose, wetting agents, dyes, adhesion promoters and finely divided pigments and, if required, UV absorbers.

To effect color change after exposure, the photosensitive mixture can also be admixed with small amounts of radiation-sensitive components that preferably form or split off strong acids upon exposure and cause a color change in a subsequent reaction with a suitable dye. Such radiation-sensitive components include, for example, 1,2-naphthoquinonediazide-4-sulfonic acid chloride, halogenomethyl-s-triazines containing chromophoric substituents or diazonium compounds in the form of their salts with complex acids, such as tetrafluoroboric acid or hexafluorophosphoric acid.

For coating a suitable layer support, i.e., for producing a photosensitive recording material, the mixtures are usually dissolved in a solvent. The selection of appropriate solvents depends on the intended coating process, the layer thickness and the drying conditions. Suitable solvents for the composition of the invention include ketones, such as methyl ethyl ketone; chlorinated hydrocarbons, such as trichloroethylene and 1,1,1-trichloroethane; alcohols, such as n-propanol; ethers, such as tetrahydrofuran; alcohol ethers, such as an ethylene or propylene glycol monoalkyl ether; and esters, such as butyl acetate or propylene glycol alkyl ether acetate. It is also possible to use mixtures which, for special purposes, may additionally contain other solvents, such as acetonitrile, dioxane or dimethyl formamide. In principle any solvents can be used that do not irreversibly react with the layer components. Partial ethers of glycols, in particular ethylene glycol monomethyl ether and propylene glycol monomethyl ether are particularly preferred.

In most cases, the supports used for layer thicknesses of less than about 10 $\mu$m are metals. The following can be used for offset printing plates: mill-finished, mechanically or electrochemically grained and optionally anodically oxidized aluminum, which additionally may have been chemically pretreated, for example, with polyvinylphosphonic acid, silicates, phosphates, hexafluorozirconates or with hydrolyzed tetraethyl orthosilicate.

Coating of the layer support is carried out in a known manner by means of spin-coating, spraying, dipping, roller-coating, application with slot dies, blade-spreading or flow-coater application.

Exposure is performed with the aid of conventionally used light sources.

Aqueous-alkaline solutions having a graduated alkalinity are used for developing; the solutions preferably have a pH in the range from about 10 to 14 and they can also contain minor amounts of organic solvents or surfactants.

To produce a printing form, the photosensitive recording material is imagewise exposed through a positive original and then developed with an aqueous-alkaline developer solution. Imagewise exposure is performed by means of tubular lamps, pulsed xenon flash lamps, metal-halide doped mercury vapor lamps and carbon arc lamps.

Compared with the known positive-working copying layers, the layers prepared in accordance with this invention have a markedly improved photospeed, without any noticeable disadvantages in their copying or printing behavior, i.e., impairment of the resistance to overdevelopment or narrowing of the development range or deterioration of the gradation, image contrast or shorter print run, being observed.

The invention will now be explained in greater detail by reference to the Examples below.

EXAMPLE 1

An electrochemically grained and anodically oxidized aluminum sheet was coated with a solution of

| | |
|---|---|
| 1.600 parts by weight | of the esterification product of 1 mole of 2,3,4-trihydroxy-benzophenone and 3 moles of 1,2-naphthoquinone-2-diazide-5-sulfonic acid chloride, |
| 6.400 parts by weight | of a cresol-formaldehyde novolak having a softening range from 127° to 145° C., |
| 0.200 parts by weight | of 1,2-naphthoquinone-2-diazide-4-sulfonic acid chloride, |
| 0.070 parts by weight | of crystal violet, |
| 0.400 parts by weight | of bis-(4-hydroxyphenyl)-sulfone, and |
| 0.200 parts by weight | of a non-plastified-melamine-formaldehyde resin etherified with isobutyl, in |
| 40.00 parts by weight | of ethylene glycol monomethyl ether, and |
| 55.00 parts by weight | of tetrahydrofuran. |

Before the photosensitive copying layer was applied, the anodically oxidized aluminum support had been treated with an aqueous solution containing 0.1% by weight of polyvinyl phosphonic acid.

The presensitized material prepared in this manner, in which the photosensitive layer had a layer weight of about 3.0 g/m$^2$ was exposed imagewise under a transparent positive original representing a UGRA offset test wedge, for a duration of 55 exposure units (corresponding to 47 seconds), with the aid of a 500 watts metal halide lamp arranged at a distance of 103 cm and was then developed by wiping with a 3% strength aqueous solution of sodium silicate. In the developing procedure, the portions of the copying layer which had been struck by light were removed and the unexposed image areas remained on the layer support, such that a printing stencil corresponding to the original was obtained.

The optimum exposure time was defined as the time lapsing before complete removal of the 8 μm microline field by development.

When another printing form of this type is prepared, employing the same layer thickness, support material and test conditions as above, except that the bis-(4-hydroxyphenyl)sulfone admixture according to this invention is omitted, the exposure time required until, on the developed plate, the 12 μm circular microline field is present as a completely solid area (or the 8 μm microline field is completely removed, respectively) amounts to 80 exposure units or 67 seconds. This means that by the addition of the bis-(4-hydroxyphenyl) compound in accordance with this invention to the photosensitive layer, the photospeed is increased by about 30%, without any disadvantageous effect being observed with regard to resistance to overdevelopment and development range.

When the bis-(4-hydroxyphenyl)-sulfone is replaced by an equal amount of the 2,3,4-trihydroxybenzophenone/formaldehyde condensation product described in German Offenlegungsschrift No. 28 47 878 and the resulting solution is employed to prepare a printing form under the same test conditions as above, and exposure is performed as above, the test pattern resulting after development by immersion into a trough is substantially identical to the test pattern obtained above. If development is, however, performed manually with the aid of a plush pad, under otherwise unchanged conditions, the resulting printing form seems to be insufficiently exposed, compared with the test pattern on the test wedge obtained after the trough development.

This leads to the following conclusion: In the case of manual development of the comparison material, the exposure time must be increased by about 22%, in order to achieve the same test result, i.e., the same transfer of tone values as in the case of trough development.

For practical applications, this interdependence between the exposure time and the development process employed is of great disadvantage. By using the compounds according to this invention, this inappropriate behavior of the material is avoided. Printing forms prepared in accordance with this invention show essentially the same test results both after trough and manual development.

EXAMPLE 2

An electrochemically grained and anodically oxidized aluminum sheet was coated with a solution of

| | |
|---|---|
| 1.600 parts by weight | of the esterification product of 1 mole of 2,3,4-dihydroxy-3,5-dibromobenzophenone and 2 moles of 1,2-naphthoquinone-2-diazide-5-sulfonic acid chloride, |
| 6.400 parts by weight | of the cresol-formaldehyde novolak of Example 1, |
| 0.200 parts by weight | of 1,2-naphthoquinone-2-diazide-4-sulfonic acid chloride, |
| 0.070 parts by weight | of crystal violet, and |
| 0.400 parts by weight | of biphenyldiol-(4,4'), in |
| 40.00 parts by weight | of propylene glycol monomethyl ether, and |
| 55.00 parts by weight | of tetrahydrofuran. |

Before the photosensitive layer was applied, the aluminum support had been treated with an aqueous solution containing 0.1% by weight of polyvinyl phosphonic acid.

The photosensitive material prepared in this manner, in which the photosensitive layer had a layer weight of about 3.0 g/m$^2$ was exposed imagewise under a transparent positive test original for a duration of 55 exposure units and was then developed by wiping with a 3% strength aqueous solution of sodium silicate.

When another printing form of this type is prepared, employing the same layer thickness, test conditions and test original as above, except that the biphenyldiol-(4,4') admixture is omitted, 80 exposure units are required to achieve an optimum exposure.

When the biphenyldiol-(4,4') is replaced by an equal amount of gallic acid, as described in German Offenlegungsschrift No. 32 01 151, the improvement in photospeed is the same, but the printing stencil thus produced is not resistant to overdevelopment, and after a developing treatment with the above described alkaline developer of only three minutes, it is completely dissolved away from the support.

When the biphenyldiol-(4,4') is replaced by 1,2,3,6-tetrahydrophthalic anhydride, as is taught in German Offenlegungsschrift No. 26 57 922 (equivalent to U.S. Pat. No. 4,115,128) to improve the photospeed of diazo layers, an exposure time corresponding to 68 units is required under otherwise identical conditions.

EXAMPLE 3

An electrochemically grained and anodically oxidized aluminum sheet, which had been pretreated as described in Example 1, was coated with a solution of

| | |
|---|---|
| 1.600 parts by weight | of the esterification product of 1 mole of 2,3,4-trihydroxy-benzophenone and 3 moles of 1,2-naphthoquinone-2-diazide-5-sulfonic acid chloride, |
| 6.400 parts by weight | of the cresol-formaldehyde novolak of Example 1, |
| 0.200 parts by weight | of 1,2-naphthoquinone-2-diazide-4-sulfonic acid chloride, |
| 0.070 parts by weight | of crystal violet, |
| 0.400 parts by weight | of bis-(4-hydroxyphenyl)-ketone, and |
| 0.200 parts by weight | of a non-plastified melamine-formaldehyde resin etherified with isobutyl, in |
| 40.00 parts by weight | of ethylene glycol monomethyl ether, and |
| 55.00 parts by weight | of tetrahydrofuran. |

The printing plate prepared in this way, which had a layer weight of 3.0 g/m², was exposed as described in Example 1, under a transparent positive original in the presence of an UGRA offset test wedge, such that following development the 12 μm microline field of the copied test wedge was found to be fully solid on the plate and the 8 μm microline field was completely removed. The required exposure time corresponded to 56 units.

Without the addition of the bis-(4-hydroxyphenyl)-ketone, 78 exposure units were required under otherwise identical test conditions.

When the bis-(4-hydroxyphenyl)-ketone is replaced by 2,4-dihydroxybenzophenone or by 2,3,4-trihydroxybenzophenone and exposure is carried out under the same conditions as above, 69 exposure units are necessary to achieve complete removal of the 8 μm microline field in the course of development.

EXAMPLE 4

An electrochemically grained and anodically oxidized aluminum sheet was coated with a solution of

| | |
|---|---|
| 1.600 parts by weight | of the esterification product of 1 mole of bis-(3-benzoyl-4,5,6-trihydroxyphenyl)-methane and 6 moles of 1,2-naphthoquionone-2-diazide-5-sulfonic acid chloride, |
| 6.400 parts by weight | of the cresol-formaldehyde novolak of Example 1, |
| 0.200 parts by weight | of 1,2-naphthoquinone-2-diazide-4-sulfonic acid chloride, |
| 0.070 parts of weight | of crystal violet, and |
| 0.200 parts by weight | of 2,2-bis-(4-hydroxyphenyl)-propane, in |
| 40.00 parts by weight | of ethylene glycol monomethyl either, and |
| 55.00 parts by weight | of tetrahydrofuran. |

Before the photosensitive layer was applied, the aluminum support had been treated with an aqueous solution containing 0.1% by weight of polyvinyl phosphonic acid.

The printing plate prepared in this way, which had a layer weight of 3.0 g/m², was exposed as described in Example 1, under a transparent positive original in the presence of an UGRA offset test wedge, such that following development the 12 μm microline field of the copied test wedge was fully solid on the plate and the 8 μm microline filed was completely remove. The required exposure time corresponded to 56 units. Without the addition of the bis-(4-hydroxyphenyl)-propane, 78 exposure units were required under otherwise identical test conditions.

What is claimed is:

1. A photosensitive mixture comprising in admixture:
   an ester or an amide of a 1,2-naphthoquinonediazide sulfonic or carboxylic acid, present in an amount sufficient to render the mixture photosensitive;
   a phenolic resin binder that is soluble in aqueous-alkaline solutions and insoluble in water, present in an amount sufficient to produce a uniform film when the mixture is cast; and
   a speed enhancer present in an amount sufficient to measurably improve the photospeed of the composition comprising a compound of the general formula

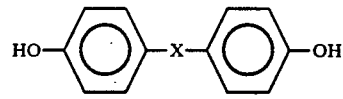

where X denotes a single bond, SO₂, S, CO, CHCCl₃ or

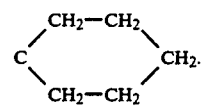

2. A mixture as claimed in claim 1, comprising 0.5 to 15 percent by weight of the speed-enhancing compound, relative to the weight of the non-volatile constituents.

3. A mixture as claimed in claim 1, comprising an alkali-soluble resin binder selected from the group consisting of a novolak condensation resin and a polymer or a copolymer of an acrylate or methacrylate esterified with a polyvalent phenol.

4. A mixture as claimed in claim 3, wherein the mixture comprises from 30% to 90% by weight of the alkali-soluble resins recited in claim 3, based on the total solids content.

5. A mixture as claimed in claim 3, wherein the mixture comprises from 55% to 85% by weight of the alkali-soluble resins recited in claim 3, based on the total solids content.

6. A mixture as claimed in claim 1, further comprising a non-plastified melamine/formaldehyde resin.

7. A mixture as claimed in claim 6, further comprising an alkyletherified melamine/formaldehyde resin.

8. A mixture as claimed in claim 1, wherein the mixture comprises from 1% to 10% by weight of the speed-enhancing compound, relative to the weight of the non-volatile constituents.

9. A mixture as claimed in claim 1, wherein the mixture comprises from 3% to 50% by weight of the naphthoquinonediazide compound, based on total solids content.

10. A mixture as claimed in claim 1, wherein the mixture comprises from 8% to 25% by weight of the naphthoquinonediazide compound, based on total solids content.

11. A mixture as claimed in claim 1, wherein the speed-enhancing compound is selected from the group consisting of biphenyldiol-(4,4'), bis-(4-hydroxyphenyl)-ketone and bis-(4-hydroxyphenyl)-sulfone.

12. A mixture as claimed in claim 1, wherein the speed-enhancing compound is biphenyldiol-(4,4').

13. A mixture as claimed in claim 1, wherein the speed-enhancing compound is bis-(4-hydroxyphenyl)-ketone.

14. A mixture as claimed in claim 1, wherein the speed-enhancing compound is bis-(4-hydroxyphenyl)-sulfone.

15. A mixture as claimed in claim 1, wherein X denotes S.

16. A mixture as claimed in claim 1, wherein X denotes $CHCCl_3$.

17. A mixture as claimed in claim 1, wherein X denotes

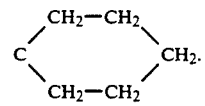

18. A mixture as claimed in claim 1, consisting essentially of the recited components.

19. A photosensitive recording material comprising a layer support and a photosensitive layer prepared from a mixture as claimed in claim 1.

* * * * *

UNITED STATES PATENT AND TRADEMARK OFFICE
CERTIFICATE OF CORRECTION

PATENT NO. : 5,225,310
DATED : July 6, 1993
INVENTOR(S) : STAHLHOFEN et al.

It is certified that error appears in the above-indentified patent and that said Letters Patent is hereby corrected as shown below:

On the Title Page, Item [30]:    Foreign Application Priority Data, please add --P 37 18 416.4 [DE] Federal Republic of Germany June 2, 1987--.

Signed and Sealed this

Twenty-first Day of June, 1994

*Attest:*

BRUCE LEHMAN

*Attesting Officer*    *Commissioner of Patents and Trademarks*